(12) United States Patent
Yamashita et al.

(10) Patent No.: US 7,995,632 B2
(45) Date of Patent: *Aug. 9, 2011

(54) NITRIDE SEMICONDUCTOR LASER CHIP AND FABRICATION METHOD THEREOF

(75) Inventors: Fumio Yamashita, Nara (JP); Shigetoshi Ito, Shijonawate (JP); Shuichiro Yamamoto, Tenri (JP); Toshiyuki Kawakami, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 272 days.

This patent is subject to a terminal disclaimer.

(21) Appl. No.: 12/155,186

(22) Filed: May 30, 2008

(65) Prior Publication Data

US 2008/0298409 A1 Dec. 4, 2008

(30) Foreign Application Priority Data

May 31, 2007 (JP) .................................. 2007-144428

(51) Int. Cl.
*H01S 3/04* (2006.01)
*H01S 3/20* (2006.01)

(52) U.S. Cl. ...................................... 372/43.01; 372/54

(58) Field of Classification Search ............... 372/43.01, 372/44.011, 54
See application file for complete search history.

(56) References Cited

U.S. PATENT DOCUMENTS

| 6,737,678 B2 * | 5/2004 | Kawakami et al. ............. 257/79 |
| 2001/0030328 A1 | 10/2001 | Ishida |
| 2001/0048114 A1 | 12/2001 | Morita et al. |
| 2005/0116243 A1 * | 6/2005 | Mochida ......................... 257/98 |
| 2007/0121692 A1 * | 5/2007 | Kawakami et al. ......... 372/43.01 |

FOREIGN PATENT DOCUMENTS

| JP | 62-190892 | | 8/1987 |
| JP | 08-213692 | * | 8/1996 |
| JP | 10-051029 | * | 2/1998 |
| JP | 2007-180522 | | 7/2007 |

* cited by examiner

*Primary Examiner* — Armando Rodriguez
(74) *Attorney, Agent, or Firm* — Harness, Dickey & Pierce, P.L.C.

(57) ABSTRACT

In a nitride semiconductor laser chip so structured as to suppress development of a step on nitride semiconductor layers, the substrate has the (1-100) plane as the principal plane, the resonator facet is perpendicular to the principal plane, and, in the cleavage surface forming the resonator facet, at least by one side of a stripe-shaped waveguide, an etched-in portion is formed as an etched-in region open toward the surface of the nitride semiconductor layers.

8 Claims, 8 Drawing Sheets

NITRIDE SEMICONDUCTOR LASER CHIP AND FABRICATION METHOD THEREOF

This nonprovisional application claims priority under 35 U.S.C. §119(a) on Patent Application No. 2007-144428 filed in Japan on May 31, 2007, the entire contents of which are hereby incorporated by reference.

BACKGROUND OF THE INVENTION

1. Field of the Invention

The present invention relates to a nitride semiconductor laser chip and to a method for fabricating it. More specifically, the invention relates to a nitride semiconductor laser chip having nitride semiconductor layers laminated on a nitride semiconductor substrate having a particular planar orientation, and to a method for fabricating such a nitride semiconductor laser chip.

2. Description of Related Art

Nitride semiconductors are compounds of N (nitrogen), which is a group V element, with a group III element, such as Al (aluminum), Ga (gallium), and In (indium). For their band structures and chemical stability, nitride semiconductors have been receiving much attention as semiconductor materials for light-emitting devices and power devices, and have been tried in various applications. Especially active is the development of nitride semiconductor laser chips that emit light in the ultraviolet to visible region as light sources for optical information recording apparatuses, illumination apparatuses, display apparatuses, sensors, etc.

In a nitride semiconductor laser chip, it is common to use a nitride semiconductor substrate, that is, a substrate of the same type of material as the nitride semiconductor layers to be laminated on its surface. This helps enhance the quality of the laminated nitride semiconductor layers and thereby enhance the characteristics of the semiconductor laser chip. Typically used as such a substrate is, for its ease of fabrication, a crystal having a wurtzite structure and having the (0001) plane as its principal plane. When a crystal of nitride semiconductor layers is formed on this substrate, it grows, likewise, with the (0001) plane as its principal plane.

With such a semiconductor laser chip having nitride semiconductors laminated with the (0001) plane as the principal plane, that is, having them laminated in the [0001] direction (in the C-axis direction), there is concern for a drop in the electron hole recombination probability ascribable to the Stark effect under the influence of an internal electric field in a quantum well active layer. As a chip structure that alleviates this disadvantage, there have also been studied nitride semiconductor laser chips having a laminate structure formed in the direction perpendicular to the C-axis (see JP-A-H8-213692 and JP-A-H10-51029).

With a nitride semiconductor laser chip laminated in the direction perpendicular to the C-axis in this way, the reduced influence of the Stark effect and the increased crystal asymmetry in the quantum well plane are expected to lead to an increased gain, and moreover the suppression of the penetrating dislocation, which tends to develop in the C-axis direction, developing in the lamination direction is expected to lead to enhanced crystallinity, and hence a reduced threshold current density. All this predicts high-performance chip characteristics with excellent reliability.

In an expression representing a plane or orientation of a crystal, it is convention in crystallography to signify a negative index by putting a horizontal line over its absolute value; in the present specification, however, since that notation cannot be adopted, a negative index is instead signified by putting a minus sign "−" before its absolute value.

Disadvantageously, however, even a nitride semiconductor laser chip laminated on a nitride semiconductor substrate having the (1-100) plane as the principal plane as described above does not offer satisfactory characteristics: when such a chip is subjected to CW (continuous wave) lasing (continuous lasing) up to a high output, a certain proportion of its samples (individual chips actually fabricated) break down before reaching a satisfactory light output.

Moreover, with this conventional nitride semiconductor laser chip, the proportion of its samples that break down increases with the length of time for which they are driven. Depending on the conditions under which they are driven, it may even occur that most samples of the nitride semiconductor laser chip fabricated offer unsatisfactory reliability. This indicates that a nitride semiconductor laser chip laminated on a nitride semiconductor substrate having the (1-100) plane as the principal plane suffers from, as inherent in its characteristics, inconveniences that cannot be overcome with conventional knowledge, specifically the disadvantage of extremely low yields of acceptable samples and the risk of sudden breakdown in actual use for a long time.

In search of the cause, therefore, the inventors of the present invention have done intensive studies, and as a result have found out the following facts: at resonator (cavity) facets, in an active layer, a step (unflushness) develops parallel to nitride semiconductor layers, resulting in poor flatness; furthermore, the step causes damage to the crystal nearby, and also causes unsatisfactory adhesion of coating film around and hence poor protection of the facet, resulting in poor resistance to damage at laser resonator facets.

SUMMARY OF THE INVENTION

In view of the conventionally encountered inconveniences mentioned above, it is an object of the present invention to provide a nitride semiconductor laser chip so structured as to suppress development of a step (unflushness) on nitride semiconductor layers. It is another object of the invention to provide a method for fabricating a nitride semiconductor with suppressed development of a step on nitride semiconductor layers, in order thereby to improve its yield and reliability.

To achieve the above objects, according to one aspect of the invention, a nitride semiconductor laser chip is provided with: a nitride semiconductor substrate; a plurality of nitride semiconductor layers laminated on the surface of the nitride semiconductor substrate and including an active layer; a stripe-shaped waveguide formed on the nitride semiconductor layers; and a resonator (cavity) facet formed as a result of the nitride semiconductor layers, together with the nitride semiconductor substrate, being cleaved. Here, the principal plane of the nitride semiconductor substrate is the (1-100) plane, and the resonator facet is perpendicular to the principal plane. Moreover, in the cleavage surface forming the resonator facet, at least by one side of the stripe-shaped waveguide, an etched-in portion is formed as an etched-in region open toward the surface of the nitride semiconductor layers.

With this structure, it is possible to reset, with the etched-in portion, the step that develops at the resonance facet during cleaving. This prevents development of a step at the stripe-shaped waveguide.

In the nitride semiconductor laser chip described above, it is preferable that the bottom surface of the etched-in portion reach a nitride semiconductor layer located closer to the nitride semiconductor substrate than to the active layer.

It is preferable that the etched-in portion be formed at a distance of 2 μm or more but 200 μm or less from the stripe-shaped waveguide.

It is preferable that a protective film be formed on the surface of the etched-in portion.

It is preferable that the etched-in portion be formed, in the resonator direction of the nitride semiconductor laser chip, only in part of the chip including the cleavage surface so as not to extend completely from end to end.

Alternatively, the etched-in portion may be formed, in the resonator direction of the nitride semiconductor laser chip, from end to end, parallel to the stripe-shaped waveguide.

As the stripe-shaped waveguide, a plurality of stripe-shaped waveguides may be formed.

According to another aspect of the present invention, a method of fabricating a nitride semiconductor laser chip may include: laminating a plurality of nitride semiconductor layers including an active layer on a nitride semiconductor substrate having the (1-100) surface as the principal plane for crystal growth; forming a stripe-shaped waveguide on the nitride semiconductor layers; forming an etched-in portion in the nitride semiconductor layers as an etched-in region open toward the surface of the nitride semiconductor layers; forming, in part of a wafer having the stripe-shaped waveguide and the etched-in portion formed thereon and therein, a groove to serve as the starting point of cleavage; and applying an external force to the wafer along the groove to form a cleavage surface perpendicular to the principal plane. Here, the etched-in portion is formed at a position by a side of the stripe-shaped waveguide where the cleavage surface cuts.

In this method of fabricating a nitride semiconductor laser chip, it is preferable that the bottom surface of the etched-in portion reach a nitride semiconductor layer located closer to the nitride semiconductor substrate than to the active layer.

It is preferable that the etched-in portion be formed at a distance of 2 μm or more but 200 μm or less from the stripe-shaped waveguide.

It is preferable that the etched-in portion be formed, in the resonator direction of the nitride semiconductor laser chip, only in part of the chip including the cleavage surface so as not to extend completely from end to end.

Alternatively, the etched-in portion may be formed, in the resonator direction of the nitride semiconductor laser chip, from end to end, parallel to the stripe-shaped waveguide.

According to the invention, the provision of an etched-in portion makes it possible to reset, with the etched-in portion, the step that develops on the resonator facet during cleaving. Thus, it is possible to reset the step at the etched-in portion, which is located close to the place where the step that develops at the resonance facet originates from, and it is thus possible to prevent development of a step at the stripe-shaped waveguide, where the emission of laser takes place. In this way, it is possible to prevent damage to the facet at the laser emission portion, and it is thus possible to fabricate a nitride semiconductor laser chip that can emit laser light with satisfactory reliability even after being driven for a long time.

Moreover, according to the invention, the reduced influence of the Stark effect and the increased crystal asymmetry in the quantum well plane are expected to lead to an increased gain, and moreover the suppression of the penetrating dislocation, which tends to develop in the C-axis direction, developing in the lamination direction is expected to lead to enhanced crystallinity, and hence a reduced threshold current density. Thus, it is possible to achieve high-performance chip characteristics with excellent reliability.

DETAILED DESCRIPTION OF PREFERRED EMBODIMENTS

Figure 1:
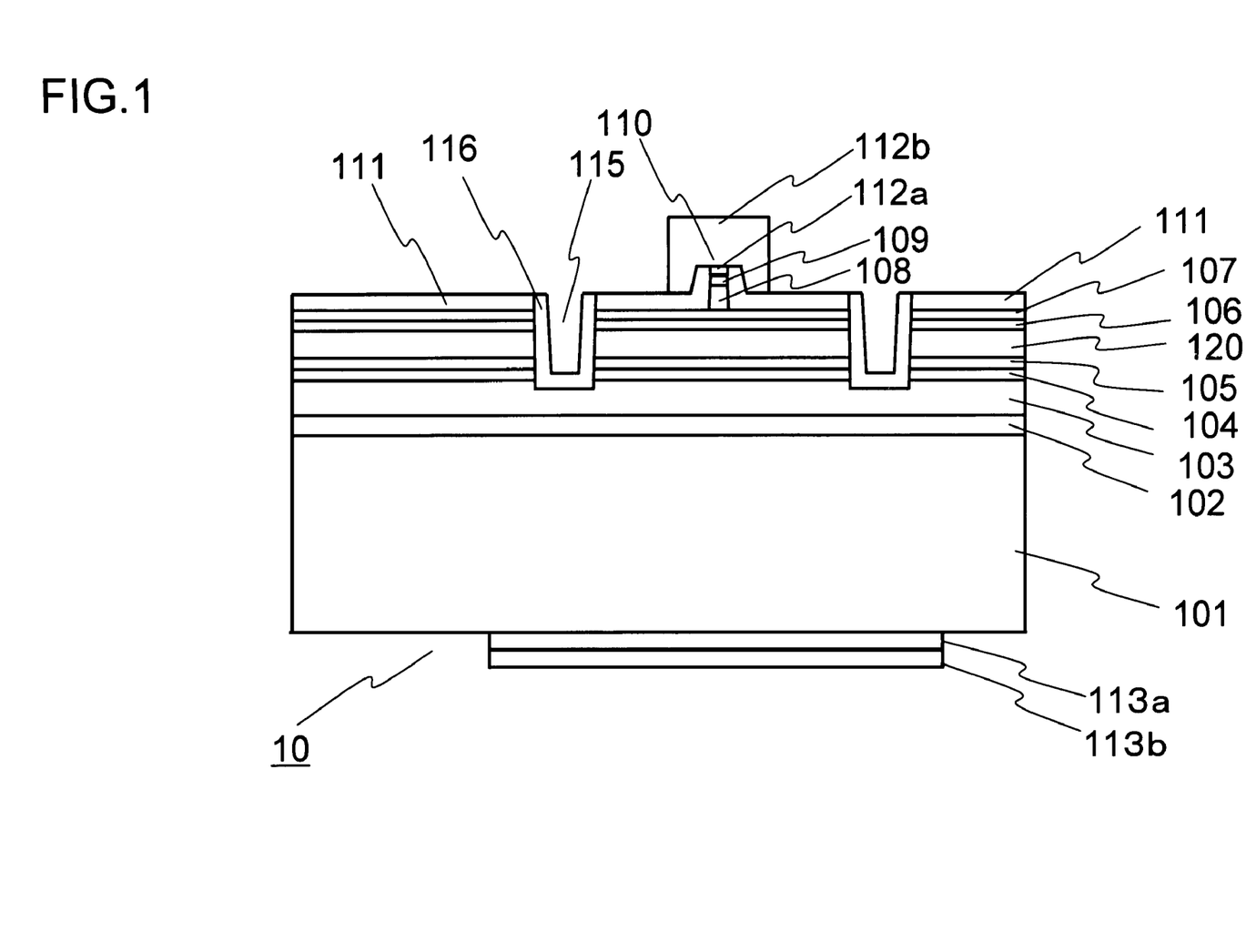
FIG. 1 is a front view showing an outline of the structure of a nitride semiconductor laser chip according to the invention.
Figure 2:
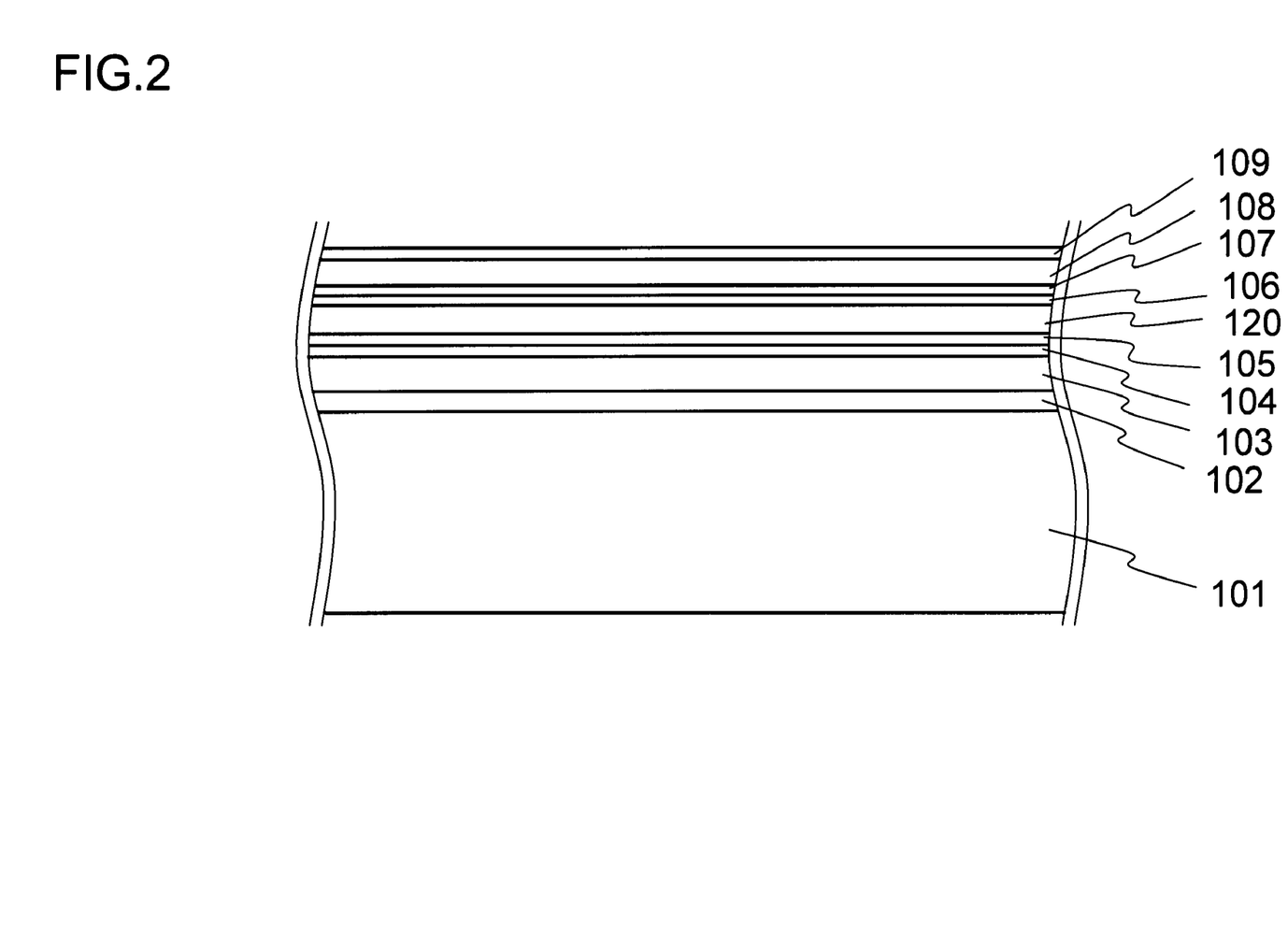
FIG. 2 is a sectional view of a wafer illustrating the fabrication procedure of a nitride semiconductor laser chip according to the invention.
Figure 3:
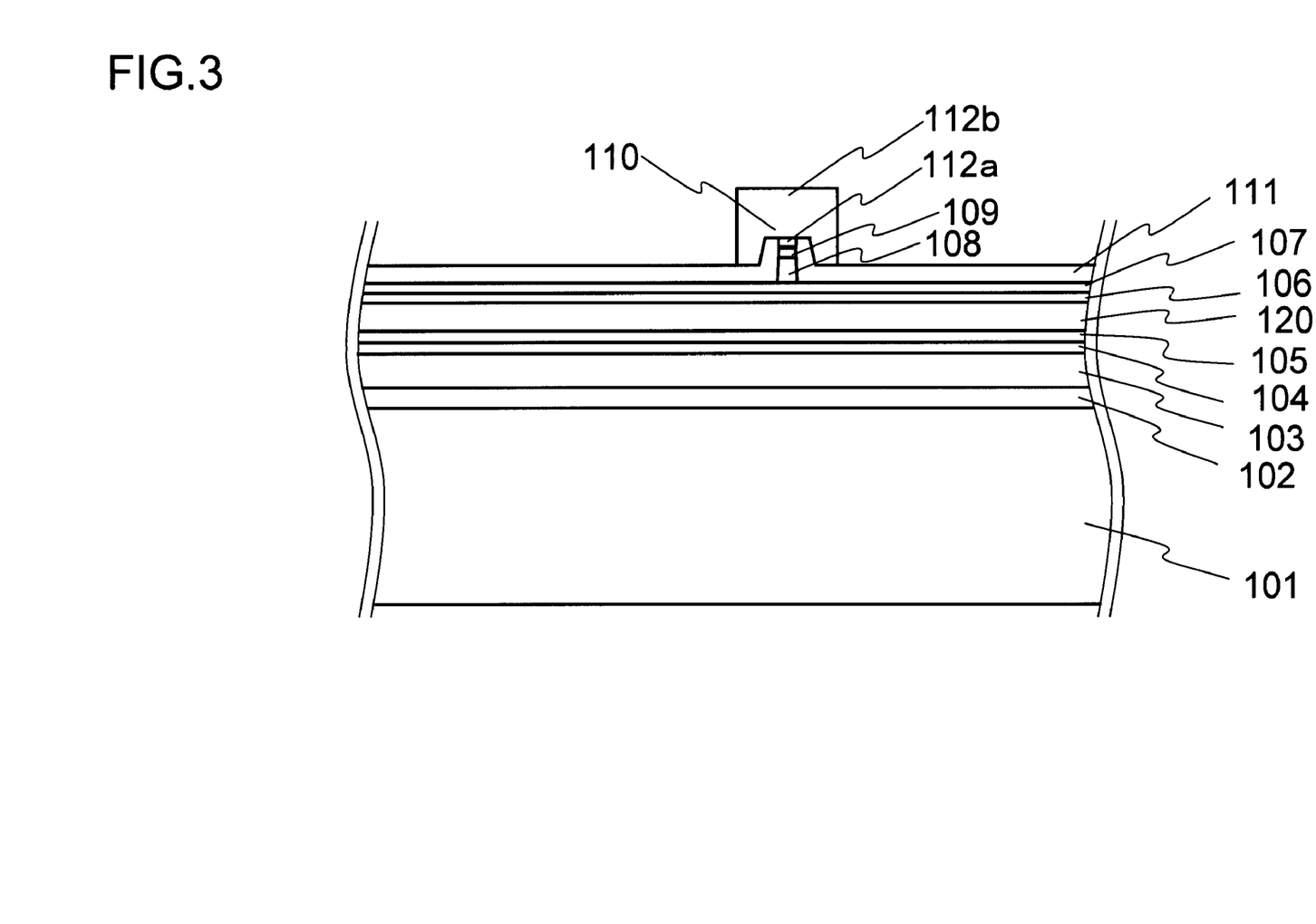
FIG. 3 is a sectional view of a wafer illustrating the fabrication procedure of a nitride semiconductor laser chip according to the invention.
Figure 4:
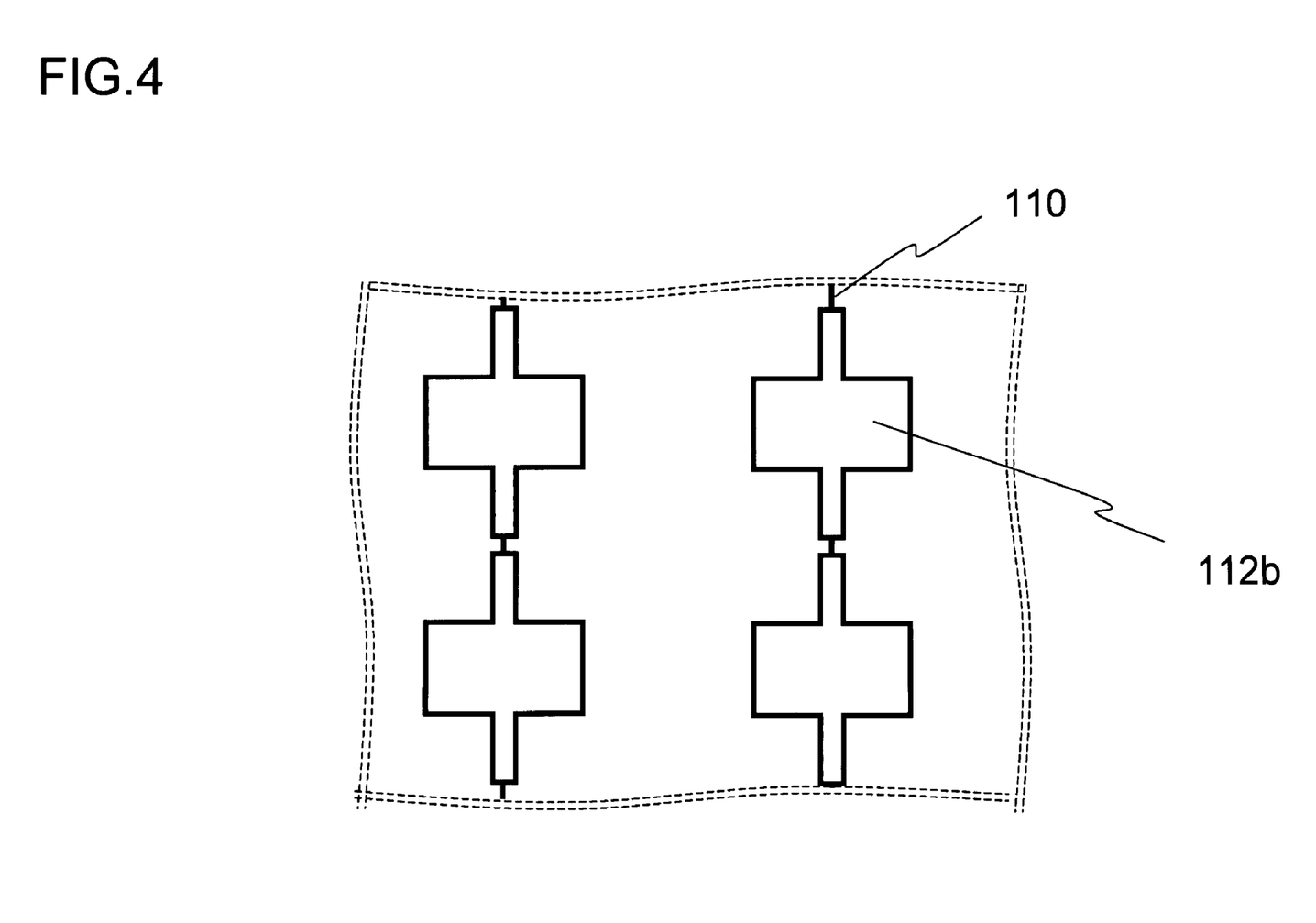
FIG. 4 is a top view of a wafer illustrating the fabrication procedure of a nitride semiconductor laser chip according to the invention.
Figure 5:
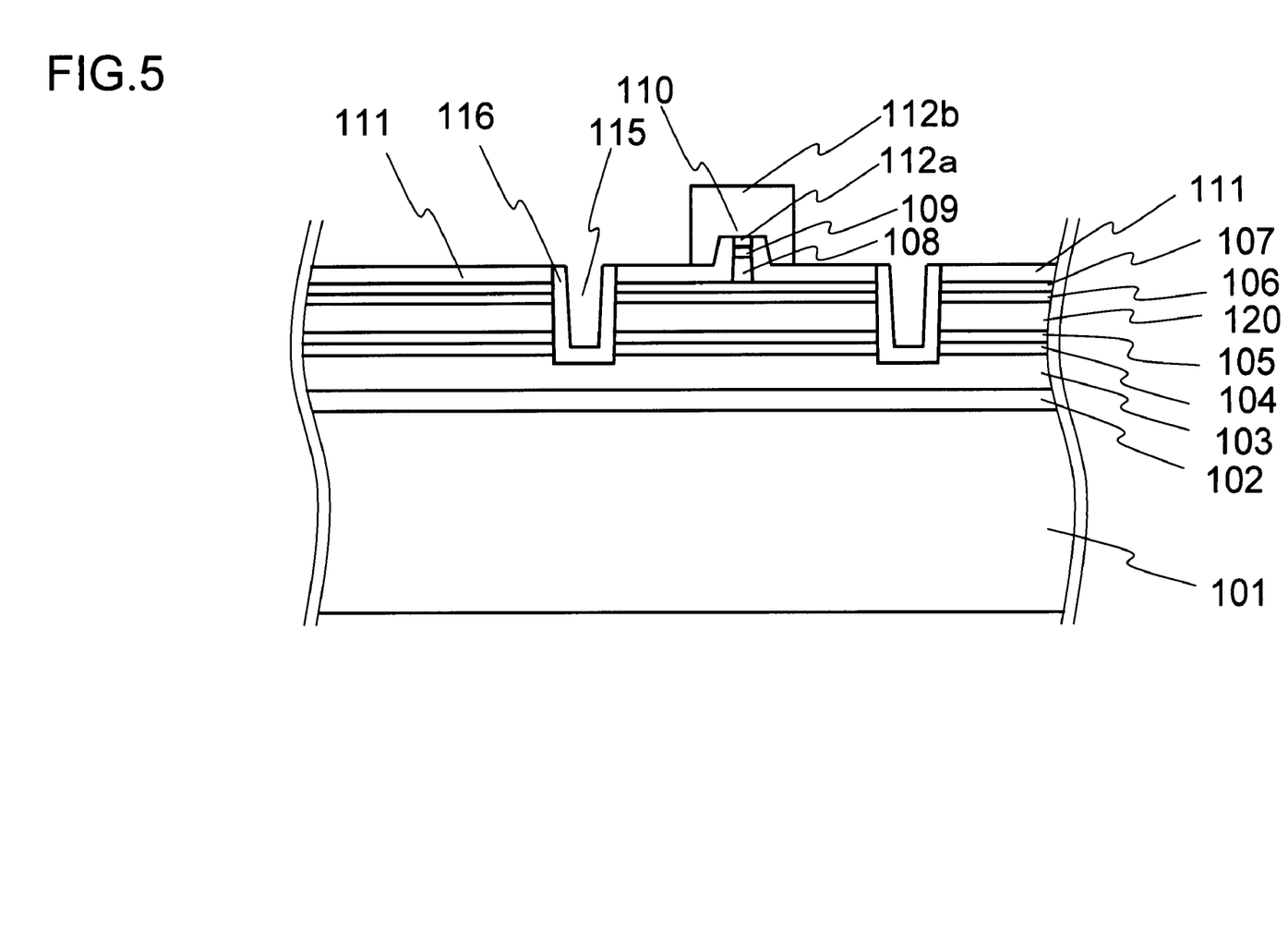
FIG. 5 is a sectional view of a wafer illustrating the fabrication procedure of a nitride semiconductor laser chip according to the invention.
Figure 6:
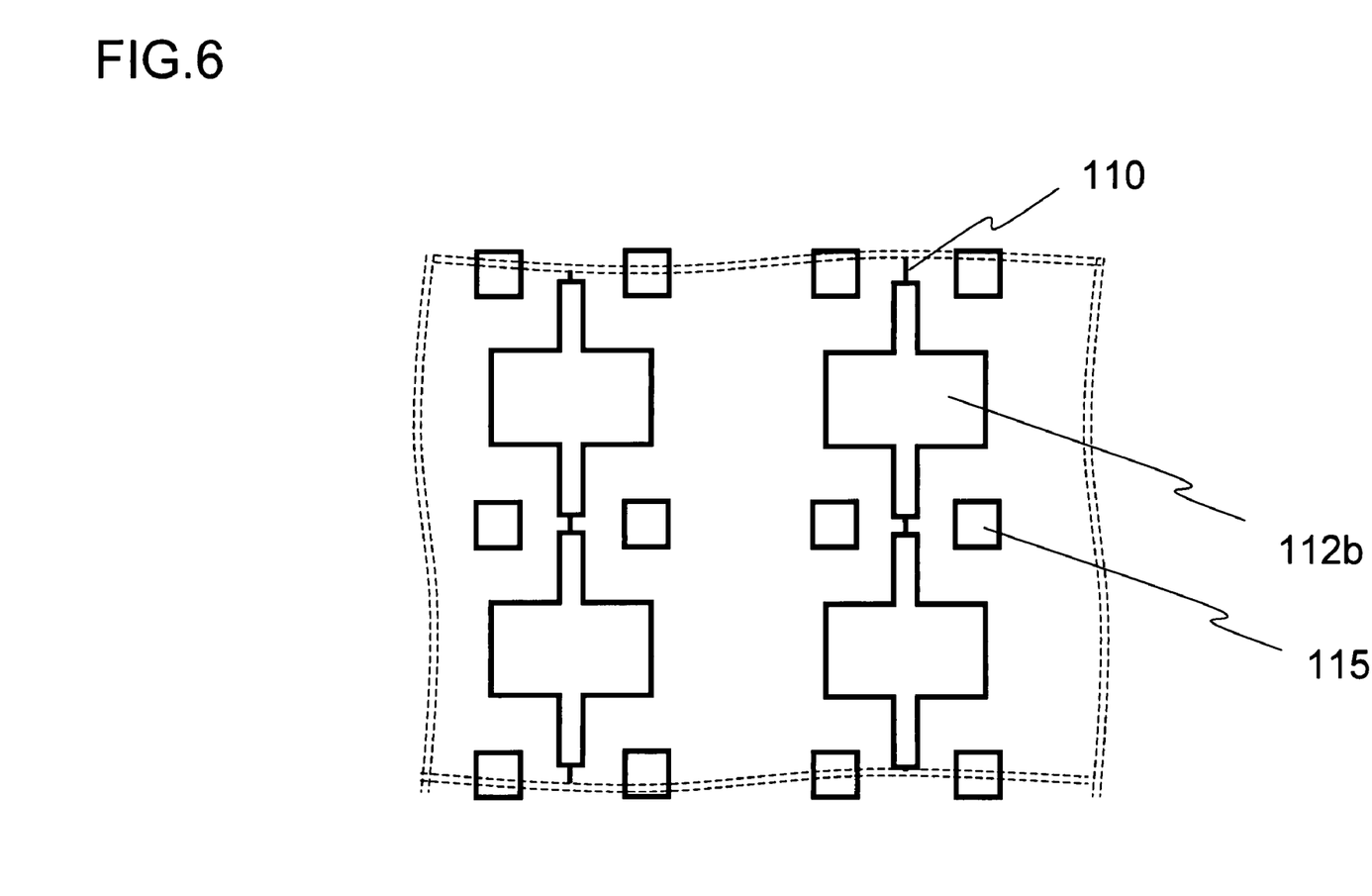
FIG. 6 is a top view of a wafer illustrating the fabrication procedure of a nitride semiconductor laser chip according to the invention.
Figure 7:
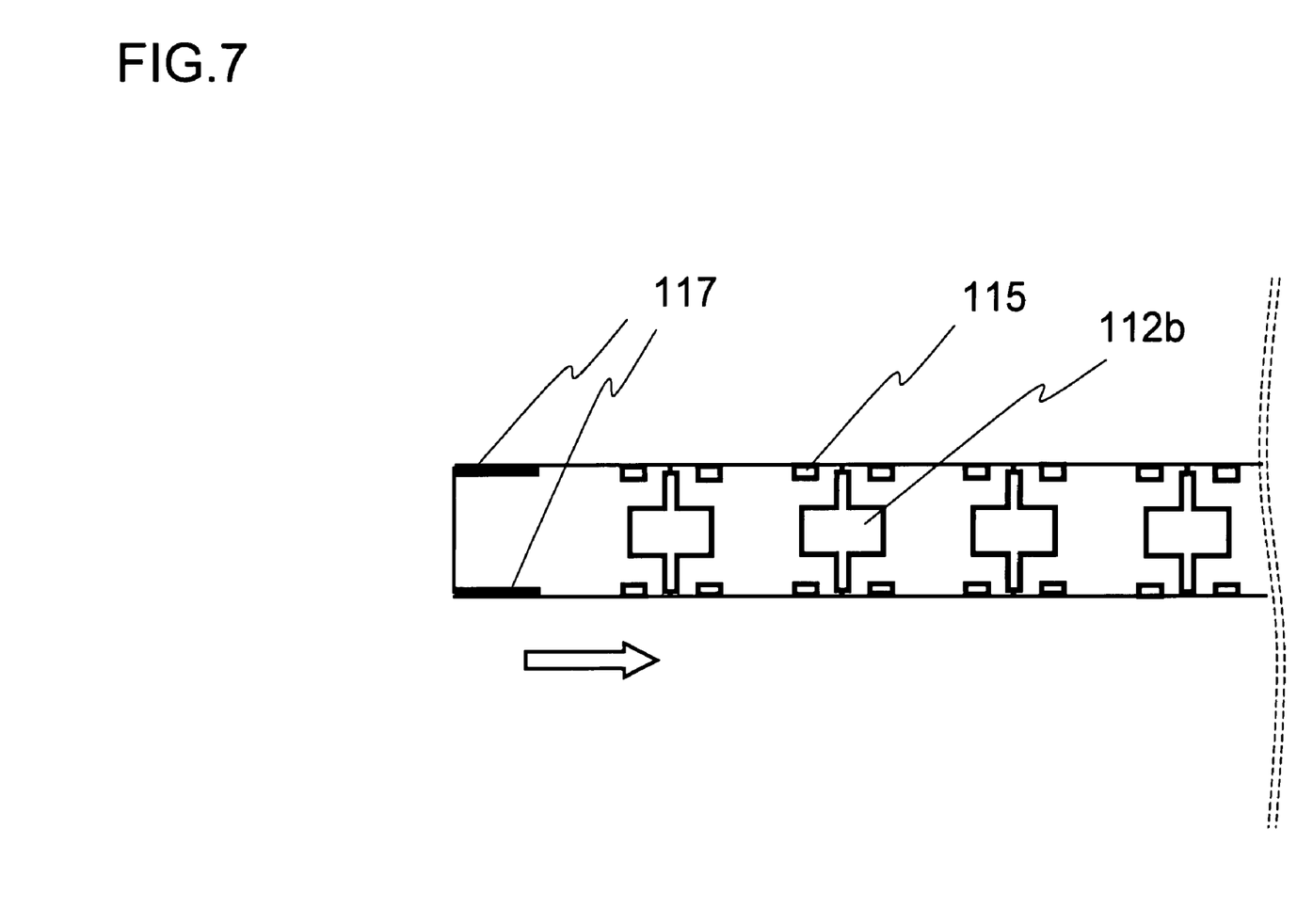
FIG. 7 is a top view of a laser bar illustrating the fabrication procedure of a nitride semiconductor laser chip according to the invention.
Figure 8:
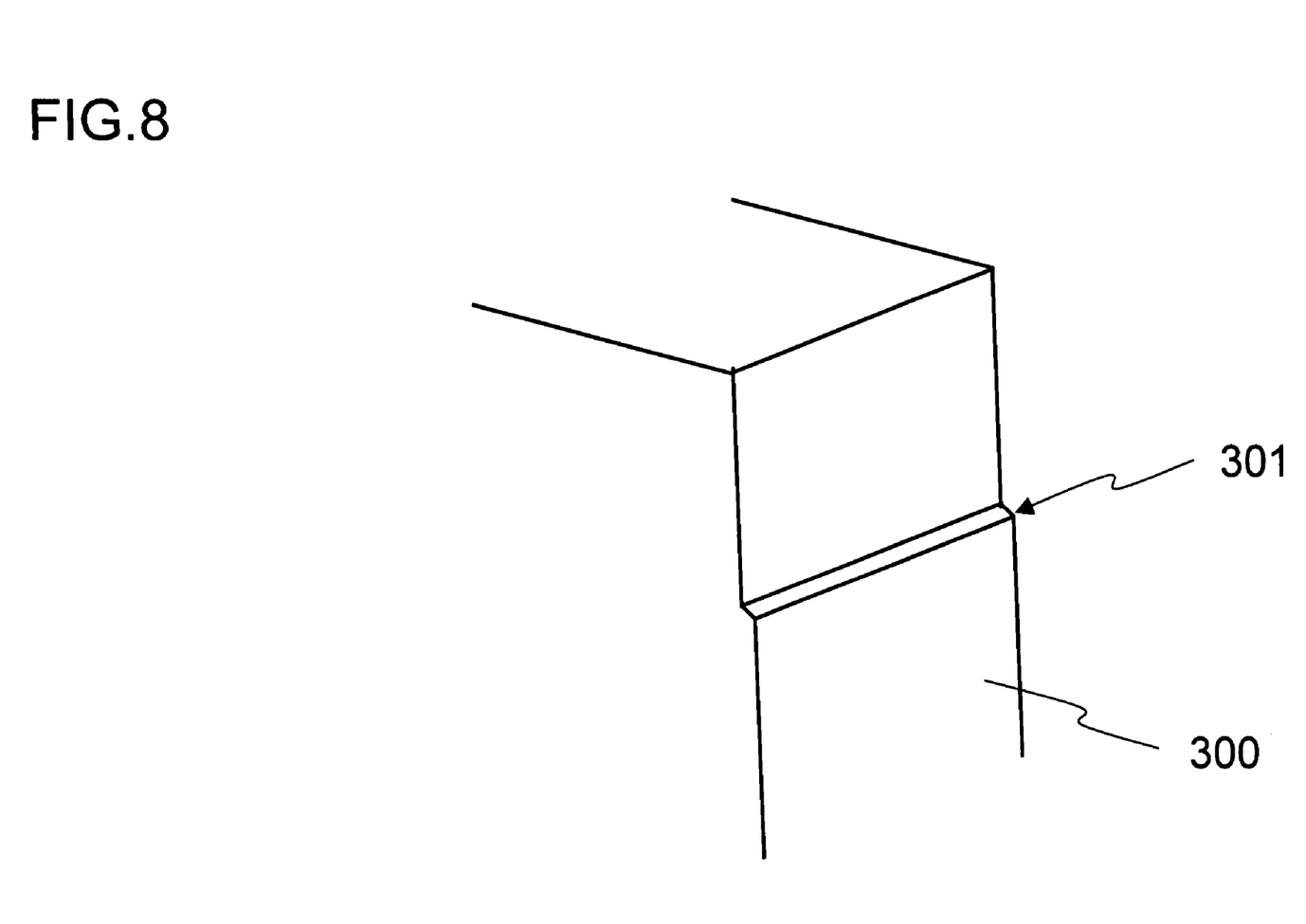
FIG. 8 is an enlarged schematic view of a cleavage surface of a nitride semiconductor laser chip as a control example.

Hereinafter, an embodiment of the present invention will be described with reference to the accompanying drawings. FIG. 1 is a front view showing an outline of the structure of a nitride semiconductor laser chip. FIGS. 2, 3, and 5 are sectional views of a wafer illustrating the fabrication procedure of a nitride semiconductor laser chip. FIGS. 4 and 6 are top views of a wafer illustrating the fabrication procedure of a nitride semiconductor laser chip. FIG. 7 is a top view of a laser bar illustrating the fabrication procedure of a nitride semiconductor laser chip. FIG. 8 is an enlarged schematic view of a cleavage surface of a nitride semiconductor laser chip as a control example.

Formation of individual layers by epitaxial growth: On the surface of an n-type GaN substrate 101 having the (1-100) plane (also called the m-plane) as the principal plane for crystal growth, by a crystal growth technology such as MOCVD (metal-organic chemical vapor deposition), nitride semiconductors are grown epitaxially to form individual nitride semiconductor layers.

Specifically, as shown in FIG. 2, on the principal plane of the n-type GaN substrate 101, the following layers are laminated in the order named: an n-type GaN lower contact layer 102 having a thickness of 0.1 to 10 μm (for example, 4 μm); an n-type AlGaN lower clad layer 103 (with an aluminum content of about 0 to 0.3, for example, 0.02) having a thickness of 0.5 to 3.0 μm (for example, 2.0 μm); an n-type GaN lower guide layer 104 having a thickness of 0 to 0.3 μm (for example, 0.1 μm); an active layer 105 having a multiple quantum well layer structure composed of alternately laminated $In_{x1}Ga_{1-x1}N$ quantum well layers and $In_{x2}Ga_{1-x2}N$ barrier layers (where $x1>x2\geq0$); a GaN intermediate layer 120 having a thickness of 0.01 to 0.1 μm (for example, 0.03 μm); a p-type AlGaN evaporation prevention layer 106 (with an aluminum content of about 0.05 to 0.4, for example, 0.2) having a thickness of 0.01 to 0.1 μm (for example, 0.03 μm); a GaN upper guide layer 107 having a thickness of 0 to 0.2 μm (for example, 0.01 μm); a p-type GaN upper clad layer 108 (with an aluminum content of about 0 to 0.3, for example, 0.02) having a thickness of 0.3 to 2 μm (for example, 0.5 μm); and a p-type GaN upper contact layer 109.

The lower clad layer 103 and the upper clad layer 108 may be formed of, instead of AlGaN, any material that suits the desired optical characteristics, such as a superlattice structure of GaN and AlGaN, a superlattice structure of GaN and InAlN, or a combination of several layers of AlGaN having different compositions. In a case where the lasing wavelength is as short as 430 nm or less, it is preferable, in terms of light confinement, that the average Al content be about 0.02 or more; provided, however, that the well layers are made thicker, or that the guide layers and barrier layers are formed of InGaN having a high index of refraction, GaN may be used instead. On the other hand, in a case where the lasing wavelength is as long as 430 nm or more, GaN or AlGaN may be used instead.

The lower guide layer 104, the upper guide layer 107, and the GaN intermediate layer 120 may be formed of, instead of GaN as described above, InGaN or AlGaN, or may be omitted if the design does not require them. The active layer 105 is designed to emit light of a wavelength of about 405 nm through an appropriate setting of the compositions of the quantum well layers and barrier layers and the structure in which these are laminated alternately.

The evaporation prevention layer 106 may be formed of any composition other than AlGaN, or may be doped with As, P, or the like, so long as it serves to prevent the degradation of the active layer 105 after its growth until the growth of the upper clad layer 108. Depending on the conditions under which the active layer 105 and the upper clad layer 108 are formed, the evaporation prevention layer 106 itself may be omitted. The upper contact layer 109 may be formed of, instead of GaN, InGaN, GaInNAs, GaInP, or the like.

Formation of a ridge stripe: Through epitaxial growth of different nitride semiconductors on the surface of the n-type GaN substrate 101 as described above, a wafer is obtained that has a laminate structure of nitride semiconductor layers as shown in FIG. 2. Next, over the entire surface of this wafer, a first p-electrode 112a is formed by vacuum deposition or the like, by use of, for example, Pd, Ni, or the like as its main ingredient. Specifically, over the entire surface of the upper contact layer 109, which is the topmost layer in FIG. 2, the p-electrode 112a is formed.

Then, by photolithography, on the surface of the p-electrode 112a, a stripe-shaped resist layer (unillustrated) having a width of 0.5 to 30 μm (for example, 1.5 μm) is formed. This stripe-shaped pattern corresponds to the waveguide of a semiconductor laser and, on the wafer, a large number of such stripes are formed parallel to one another. Subsequently, by ion etching or wet etching, the parts of the p-electrode 112a elsewhere than under the stripe-shaped resist layer are removed. The p-electrode 112a may be formed simultaneously with a pad electrode 112b, which will be formed later. In that case, on the surface of the wafer having a laminate structure of nitride semiconductor layers as shown in FIG. 2, a resist layer is formed directly, and then the process described below is performed.

Then, by dry etching relying on reactive plasma using $SiCl_4$ or $Cl_2$ gas, in the regions where the resist layer is not formed, the upper contact layer 109 and the upper clad layer 108 are removed at least halfway into their depth to form a ridge stripe 110. Here, it is preferable that the etching be stopped at a level about 0.05 μm to 0.3 μm from the top surface of the evaporation prevention layer 106 toward the upper clad layer 108 in the layer thickness direction (in FIG. 3 and other figures, for the sake of convenience, the etching is shown to be stopped at the interface between the upper guide layer 107 and the upper clad layer 108).

This gives the ridge stripe 110 a difference in effective index of refraction in the lateral direction, and thereby permits it to function as an index-of-refraction waveguide. The etching leaves the part of the upper contact layer 109 and the upper clad layer 108 under the resist layer elevated compared with the remaining region, and this elevated part of the upper contact layer 109 and the upper clad layer 108 forms the ridge stripe 110.

On the wafer thus having such ridge stripes 110 formed on it at predetermined intervals, over its entire surface, a layer of $SiO_2$ having a thickness of 0.1 μm to 0.5 μm (for example, 0.3 μm) is formed as a burying layer 111 to bury the ridge stripe 110. Here, on the burying layer 111 formed of $SiO_2$, there may be additionally formed one or more layers for enhancing the adhesion with the pad electrode 112b, which will be described later. The layer, or layers, for enhancing the adhesion with the pad electrode 112b is formed by use of an oxide such as $TiO_2$, $ZrO_2$, $HfO_2$, or $Ta_2O_5$, or a nitride such as TiN, TaN, or WN, or a metal such as Ti, Zr, Hf, Ta, or Mo.

Subsequently, the resist layer formed on the ridge stripe 110 is dissolved with a solvent and is then lifted off by ultrasonic cleaning or the like so that, along with the resist layer, the burying layer 111 formed on the top surface of the resist layer is removed. Through this process, with the burying layer 111 left behind in the regions where the ridge stripe 110 is not formed, the surface of the p-electrode 112a on the top surface of the ridge stripe 110 is exposed. In a case where the p-electrode 112a is not formed, when the resist layer is dissolved, the surface of the upper contact layer 109 on the top surface of the ridge stripe 110 is exposed instead.

Formation of a pad electrode: Through the etching and the formation of the burying layer 111 as described above, the wafer now has the ridge stripe 110 buried in the burying layer 111. Next, by photolithography, a resist layer is formed for the patterning of the pad electrode 112b, which will be formed as a p-electrode subsequently. Formed here is a resist layer (unillustrated) so patterned as to have openings formed in a matrix-like array, with each opening so located and sized as to show the ridge stripe 110 amply at the center. Specifically, the resist layer has such openings formed discontinuously both in the direction in which the ridge stripe 110 extends and in the direction perpendicular to it.

Then, on the surface of the wafer having the resist layer formed on it, layers of Mo/Au, or W/Au, or the like are formed in this order by vacuum deposition or the like, so that a pad electrode 112b (see FIGS. 3 and 4) serving as a p-electrode is formed in contact with a large part of the p-electrode 112a formed on the surface of the ridge stripe 110. In a case where the p-electrode 112a is not formed before the formation of the ridge stripe 110, in the process of forming the pad electrode 112b, as a p-electrode to which to feed electric power from outside, layers of Ni/Au, or Pd/Mo/Au, or the like are formed instead.

Subsequently, the resist layer is dissolved with a solvent and is then lifted off by ultrasonic cleaning or the like so that, along with the resist layer, the metal film formed on the top surface of the resist layer is removed. Thus, the pad electrode 112b is formed to have the same shape as the opening in the resist layer. The opening in the resist layer may be given the desired shape with consideration given to the wire-bonding region etc.

If the pad electrode 112b is formed to reach the splitting surface along which the wafer is split into individual nitride semiconductor laser chips 10 (see FIG. 1), or to be close to where an etched-in portion 115, which will be described later, is formed in the following process, there is a risk of current leakage and electrode exfoliation. It is to avoid these inconveniences that the pad electrode 112b is patterned as described above. The pad electrode 112b may be patterned by, instead of lifting-off, selective plating. It may even be patterned by etching, in which case, first, a metal film as the material for a p-electrode is vacuum-deposited over the entire surface of the wafer, then, by photolithography, the part of the metal film to be left behind as the pad electrode 112b is protected with a resist layer, and then the metal film is patterned with an aqua regia-based etchant to form the pad electrode 112b.

Forming an etched-in portion by the side of the ridge stripe: After the formation of the pad electrode 112b as described above, next, an etched-in portion is formed to prevent development of a step (unflushness) near the active layer on a cleavage surface of the nitride semiconductor laser chip 10 (see FIG. 1). First, by photolithography, a resist layer (unillustrated) is formed that has openings, one on each side of the ridge stripe 110, in regions where the pad electrode 112b is not formed. With the resist layer thus formed, by dry etching, the nitride semiconductor layers are etched in at those openings. Here, first the burying layer 111 is removed by dry etching or wet etching, and subsequently the nitride semiconductor layers under the burying layer 111 are etched in by dry etching, so that, at the openings, etched-in portions 115 (see FIGS. 5 and 6) are formed.

Then, over the surface of the wafer thus etched in at the openings in the resist layer, by sputtering or CVD (chemical-vapor deposition), a layer of $SiO_2$ having a thickness of about 0.15 μm is formed. Then, from the wafer thus having the $SiO_2$ film formed on it, the resist layer is dissolved with a solvent and is then lifted off and thereby peeled off by ultrasonic cleaning or the like so that, along with the resist layer, the $SiO_2$ film formed on the top surface of the resist layer is removed. Thus, in the etched-in portions at the openings, a protective layer 116 of $SiO_2$ film is formed as shown in the sectional view of FIG. 5. The protective layer 116 serves to protect the etched bottom and side surfaces in the etched-in portions 115, which are the portions etched in at the openings in the resist layer.

Formation of an n-side electrode: After the formation of the etched-in portions 115 as described above, the bottom surface of the wafer having the etched-in portions 115 formed in it (the bottom surface of the n-type GaN substrate 101) is ground and polished until the wafer has a thickness of 60 to 150 μm (for example, 100 μm). Then, on the bottom surface (ground and polished surface) of the wafer, layers of Hf/Al, or Ti/Al, are formed in this order by vacuum deposition or the like, so that an n-electrode 113a is formed. Then, to secure the desired ohmic characteristics in the n-electrode 113a, heat processing is performed. Then, to facilitate the mounting of the nitride semiconductor laser chip 10 (see FIG. 1) when it is mounted, a metallized electrode 113b is formed by vapor-depositing a metal film of Au or the like so as to cover the n-electrode 113a.

Formation of a mirror surface: After the formation of the n-electrode 113a and the metallized electrode 113b on the bottom surface of the wafer as described above, scribe lines (straight-line scratches) 117 are formed partly along the splitting lines, and the wafer is then cleaved in a direction substantially perpendicular to the ridge stripe 110 into a plurality of bars each having a width of 300 to 2,000 μm (for example, 800 μm), the width thus being the width of a resonator (cavity).

Typically, the scribe lines 117 are formed at one edge of the wafer, but may be formed at a plurality of positions along the splitting lines so that cleaving into bars takes place precisely along the splitting lines. In either case, cleaving starts at the scribe lines 117 and advances in one direction (as indicated by an arrow in FIG. 7), eventually achieving cleaving into bars. The cleavage surfaces form resonator facets. The thickness of the wafer is adjusted to be so small as to permit precise cleaving. The scribe lines 117 are formed through scratching achieved by diamond-point scribing or laser scribing.

Chosen as the splitting surface between bars is, of all the cleavage surfaces of a nitride semiconductor having a wurtzite structure, one perpendicular to the laminated surface. In a case where a substrate having the (1-100) plane as its principal plane is used, one choice of a cleavage surface is the (0001) plane. Thus, the splitting lines are chosen to run in the [11-20] direction of the wafer, and the waveguide is previously aligned accordingly. An alternative choice of a cleavage surface is the (11-20) plane. Choosing this plane, however, compared with the (1-100) plane, is more likely to cause deviation from the splitting lines, and requires stricter process control. In that case, a splitting surface along the [0001] direction of the wafer is chosen. In some cases, choosing the (11-26) plane may permit cleaving.

Then, on the resonator facets at opposite sides of each bar composed of a plurality of nitride semiconductor laser chips 10 (see FIG. 1) contiguous with one another, coating films are formed. The front-side and rear-side coating films are each so structured as to have the desired reflectance. For example, on the rear-side resonator facet, a high-reflection film (unillustrated) is formed that is composed of two or more layers laminated; on the front-side resonator facet, a low-reflection film (unillustrated) is formed that is composed of one or more layers laminated, such as a coating film containing 5% of alumina. This permits the laser light excited inside each of the nitride semiconductor laser chips 10 (see FIG. 1) split from the bar to be emitted through the front-side resonator facet.

Splitting into individual laser chips: The bar thus having reflective films formed on the resonator facets is then split into individual chips having a width of about 200 to 300 μm, and thus the nitride semiconductor laser chip 10 shown in FIG. 1 is obtained. Here, the splitting is performed with the splitting positions so chosen as not to affect the ridge stripe 110, for example in such a way that the ridge stripe 110 is located at the center of the nitride semiconductor laser chip 10.

The nitride semiconductor laser chip 10 thus split and thereby obtained is then mounted on a stem, and wires from outside are electrically connected to the pad electrode 112b serving as a p-electrode and to the metallized electrode 113b serving as an n-electrode. Then the nitride semiconductor laser chip 10 mounted on the stem is sealed with a cap put on the stem, and is thereby packaged as a semiconductor laser device.

Evaluation of characteristics: An evaluation conducted with the nitride semiconductor laser chip 10 thus fabricated revealed that it yielded an optical output of about 600 mW in CW (continuous wave) lasing. Further increasing the driving current resulted in device breakdown, and thus it was impossible to obtain any higher optical output. A close inspection of the breakdown revealed that the crystal was blown out at the light-emission-side facet of the waveguide, mechanically destroying the resonator facet. Thus, the chip was evaluated to have a COD (catastrophic optical damage) of about 600 mW.

As a control example, a nitride semiconductor laser chip was fabricated in the same manner as the above nitride semiconductor laser chip 10 except that no etched-in portion was formed. This chip of the control example was evaluated to have a COD of about 150 mW, obviously inferior to the nitride semiconductor laser chip 10 according to the invention.

Analysis: With the control example, the cleavage surface 300 of the bar after cleaving was closely inspected under a SEM (scanning electron microscope). The inspection revealed that, at a position near the active layer, an extremely small step (unflushness) of about 0.1 μm or less had developed parallel to the laminated surface (see FIG. 8). Such a step is not so influential as to hamper lasing, and is so small that it can be detected only by a close analysis; it has therefore not been conventionally known to be present in a laser chip employing a substrate having the (1-100) plane as the principal plane and formed by cleaving. By contrast, with the bar after cleaving according to the invention, hardly any such step was observed on the cleaving surface near the waveguide, and the cleaving surface was thus flat.

Thus, the invention suppresses the phenomenon that, in a semiconductor laser chip having a structure in which nitride semiconductors are laminated on the (1-100) plane, cleaving at a surface perpendicular to the (1-100) plane develops a step as mentioned above.

In general, in a nitride semiconductor laser chip, the active layer is formed of a material having a small energy gap combined with a comparatively large lattice constant (for example, InGaN), and the guide layer and the clad layer contiguous with it are formed of a material having a large energy gap combined with a comparatively small lattice constant (for example, GaN or AlGaN). Thus, the active layer contains strain attributable to the difference in lattice constant.

Moreover, understandably, the material of the active layer differs also in mechanical properties from the materials of the guide layer and the clad layer. Thus, when an attempt is made to cleave such a laminate structure in its entirety at a surface perpendicular to the (1-100) plane, supposedly, while the layers above and below the active layer split together, the active layer, containing InGaN, splits with a slight deviation, and, as the cleaving advance in one direction, the deviation accumulates to develop a step.

In the etched-in region, however, a part located at the splitting surface is etched in from the surface to below the active layer. Thus, the etched-in portion 115 prevents transmission of impact waves, and thereby clears a step so that it will not run beyond. Thus, unless a step develops between the etched-in portion 115 and the ridge stripe 110 during cleaving, it is possible to greatly reduce the incidence of a step 301 that develops parallel to the nitride semiconductor layers near the active layer 105 between the etched-in portion 115 and the ridge stripe 110.

When the etched-in portion 115 is formed in this way, it is preferable that the etched-in portion 115 be located at a distance of 2 μm or more from the edge of the ridge stripe 110. If the etched-in portion 115 is located at a distance of 2 μm or less from the edge of the etched-in portion 115, the structure of the etched-in portion 115 affects the optical characteristics of the nitride semiconductor laser chip 10. On the other hand, locating the etched-in portion 115 unduly far away lessens the effect of clearing a step so that it will not run beyond. Thus, it is appropriate that the etched-in portion 115 be formed at a distance of 200 μm or less from the edge of the ridge stripe 110, so as to prevent development of a step in the wafer surface between the edge of the etched-in portion 115 and the ridge stripe 110.

Furthermore, it is preferable that the distance from the bottom surface of the active layer to the bottom surface of the etched-in portion 115 be less than 1 μm at least at part of the designed splitting line. Etching in unduly deep may cause, at that position, a deviation of the cleavage surface across the entire thickness of the wafer from its top to bottom side.

The etched-in portion 115 is formed on each side of the ridge stripe 110 as shown in FIG. 7; in principle, however, it suffices to provide it on the upstream side only with respect to the direction in which cleaving advances. So long as the etched-in portion 115 is located in front of the ridge stripe 110 with respect to the direction in which impact waves travel during cleaving (so long as the etched-in portion 115 is formed between the splitting groove and the ridge stripe 110), it is possible to obtain the effect of the invention.

Forming the etched-in portion 115 on each side, however, is convenient because it permits cleaving to be performed on either side. In particular, in a case where the wafer suffers chipping or the like during the process, whereas it is difficult to form a scribe line on the side where chipping occurred, it is possible to form one on the side opposite from the planned side. Thus, forming the etched-in portion 115 on each side leads to higher productivity.

When the wafer is split into bars, to prevent an unexpected deviation in the width of bars (a deviation in the length of laser resonators), splitting grooves may be formed also in a middle portion of the wafer (a plurality of scribe lines may be formed on a single line). In this case, impact waves may travel in non-uniform directions along the splitting line (cleaving may occur in the opposite direction in a small part of the wafer). Thus, to surely prevent development of a parallel step 301 near the active layer 105 and thereby increase yields, it is preferable that the etched-in portion 115 be formed on each side of the ridge stripe 110.

In the embodiment described above, the etched-in portion 115 is formed on the splitting line only near the ridge stripe 110, so that the etched-in portion 115 is formed at positions corresponding to the four corners of the nitride semiconductor laser chip 10. The etched-in portion 115 may instead be formed over the entire surface elsewhere than near the ridge stripe 110 by etching under the conditions mentioned previously.

In particular, forming an etched-in portion in the form of a stripe-shaped groove in the resonator length direction parallel to the ridge stripe 110 eliminates the need to take into consideration the alignment of the etched-in portion with the line along which cleaving will take place (the designed splitting line). This is advantageous in terms of production process management. When the etched-in portion 115 is formed in a stripe shape in this way, however, the wire-bonding position typically lies far away from the stripe. Thus, to prevent current leakage at the etched-in portion, the pad electrode needs to be formed carefully: before the pad electrode 112b is formed, the etched-in portion 115 needs to be buried in an insulating film.

In the fabrication procedure described above, the etched-in portion 115 is formed after the ridge stripe 110 is formed. Alternatively, the etched-in portion 115 may be formed before the ridge stripe 110 is formed. In this case, there is no need to etch the burying layer 111 or form the protective layer 116 in the etched-in portion 115, and this helps reduce the number of fabrication steps. Moreover, if there is little risk of current leakage to the etched-in portion 115, there is no need to form the protective layer 116 in the etched-in portion 115; reversely, the protective layer 116 may be formed so thick as to be so shaped as to completely fill the etched-in portion 115.

Nitride semiconductor laser chips according to the invention can be applied to semiconductor laser devices used in various light source apparatuses such as optical pickups, liquid crystal displays, laser displays, illumination apparatuses, etc. For example, nitride semiconductor laser chips according to the invention can even be applied to broad area semiconductor laser devices for illumination that, despite being subject to loose restrictions in terms of the control of optical characteristics such as FFP (far-field pattern), yields an extremely high output of several watts.

Specifically, in a broad area semiconductor laser device, its high output puts much strain on the resonator facets of the nitride semiconductor laser chip. This makes it essential that no step develop on the resonator facets as in a nitride semiconductor laser chip according to the invention. Accordingly, preventing a step by forming an etched-in portion by the side of the ridge stripe in the nitride semiconductor laser chip used in a broad area semiconductor laser device is expected to lead to higher reliability. In this broad area semiconductor laser device, it is preferable that the ridge stripe of the nitride semiconductor laser chip have a width of 5 to 100 μm.

Moreover, nitride semiconductor laser chips according to the invention can be applied not only to those having a stripe-shaped waveguide of a ridge type as described above but also to those having a stripe-shaped waveguide of any other type, such as a BH (buried hetero) type or RiS (ridge by selective re-growth) type. A single nitride semiconductor laser chip may be provided with a plurality of stripe-shaped waveguides.

In the drawings of the embodiment described above, the etching for forming the ridge stripe is shown to be performed over the entire area elsewhere than at the ridge stripe. Simply to form the ridge-type waveguide, however, there is no need to perform etching over the entire area in that way, and it suffices to perform etching only near the waveguide. For example, it is possible to etch only about 3 to 30 μm from the edge of the ridge (a double-channel structure).

In a case where such a double-channel structure is adopted, the etched-in portion may in some cases be etched in from the surface of the semiconductor layer. This, however, provides a similar effect. In a nitride semiconductor laser chip of a BH type, the bottom surface of the etched-in portion is located closer to the substrate than to the etched bottom surface that defines the mesa forming the waveguide. Furthermore, nitride semiconductor laser chips according to the invention can also be applied in cases where the p-and n-types in the structure described above are reversed and the waveguide is formed on the n-type semiconductor side.

Nitride semiconductor laser chips according to the invention can be applied to semiconductor laser devices used in various light source apparatuses such as optical pickups, liquid crystal displays, laser displays, illumination apparatuses, etc.

What is claimed is:

1. A nitride semiconductor laser chip comprising:
   a nitride semiconductor substrate;
   a plurality of nitride semiconductor layers laminated on a surface of the nitride semiconductor substrate and including an active layer;
   a stripe-shaped waveguide formed on the nitride semiconductor layers; and
   a resonator facet formed as a result of the nitride semiconductor layers, together with the nitride semiconductor substrate, being cleaved,
   wherein
   a principal plane of the nitride semiconductor substrate is a (1-100) plane,
   the resonator facet is perpendicular to the principal plane,
   in a cleavage surface forming the resonator facet, at least by one side of the stripe-shaped waveguide, an etched-in portion is formed as an etched-in region open toward a surface of the nitride semiconductor layers, and
   the etched-in portion is formed, in a resonator direction of the nitride semiconductor laser chip, only in part of the chip including the cleavage surface so as not to extend completely from end to end.

2. The nitride semiconductor laser chip according to claim 1,
   wherein a bottom surface of the etched-in portion reaches a nitride semiconductor layer located closer to the nitride semiconductor substrate than to the active layer.

3. The nitride semiconductor laser chip according to claim 1,
   wherein the etched-in portion is formed at a distance of 2 μm or more but 200 μm or less from the stripe-shaped waveguide.

4. The nitride semiconductor laser chip according to claim 1,
   wherein a protective film is formed on a surface of the etched-in portion.

5. The nitride semiconductor laser chip according to claim 1,
   wherein, as the stripe-shaped waveguide, a plurality of stripe-shaped waveguides are formed.

6. A method of fabricating a nitride semiconductor laser chip comprising:
   laminating a plurality of nitride semiconductor layers including an active layer on a nitride semiconductor substrate having a (1-100) surface as a principal plane for crystal growth;
   forming a stripe-shaped waveguide on the nitride semiconductor layers;
   forming an etched-in portion in the nitride semiconductor layers as an etched-in region open toward a surface of the nitride semiconductor layers;
   forming, in part of a wafer having the stripe-shaped waveguide and the etched-in portion formed thereon and therein, a groove to serve as a starting point of cleavage; and
   applying an external force to the wafer along the groove to form a cleavage surface perpendicular to the principal plane,
   wherein the etched-in portion is formed at a position by a side of the stripe-shaped waveguide where the cleavage surface cuts, and wherein the etched-in portion is formed, in a resonator direction of the nitride semiconductor laser chip, only in part of the chip including the cleavage surface so as not to extend completely from end to end.

7. The method of fabricating a nitride semiconductor laser chip according to claim 6,
   wherein a bottom surface of the etched-in portion reaches a nitride semiconductor layer located closer to the nitride semiconductor substrate than to the active layer.

8. The method of fabricating a nitride semiconductor laser chip according to claim 6,
   wherein the etched-in portion is formed at a distance of 2 μm or more but 200 μm or less from the stripe-shaped waveguide.

* * * * *